United States Patent
Ng et al.

(10) Patent No.: US 11,341,879 B2
(45) Date of Patent: May 24, 2022

(54) REPLICA PIXEL FOR STAND-ALONE TEST OF DISPLAY DRIVER

(71) Applicant: Samsung Display Co., Ltd., Yongin (KR)

(72) Inventors: Ranick Ng, Pleasanton, CA (US); Younghoon Song, Santa Clara, CA (US); Amir Amirkhany, Sunnyvale, CA (US)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/185,237

(22) Filed: Feb. 25, 2021

(65) Prior Publication Data

US 2022/0130298 A1 Apr. 28, 2022

Related U.S. Application Data

(60) Provisional application No. 63/104,246, filed on Oct. 22, 2020.

(51) Int. Cl.
*G09G 3/00* (2006.01)
*G01R 19/165* (2006.01)

(52) U.S. Cl.
CPC ....... *G09G 3/006* (2013.01); *G01R 19/16571* (2013.01); *G09G 2300/08* (2013.01)

(58) Field of Classification Search
CPC ............... G09G 3/006; G09G 2300/08; G01R 19/16571
See application file for complete search history.

(56) References Cited

U.S. PATENT DOCUMENTS

| 10,467,936 B2 | 11/2019 | Lemons et al. |
| 10,672,338 B2 | 6/2020 | Lin et al. |
| 2016/0027382 A1 | 1/2016 | Chaji et al. |
| 2017/0025081 A1 | 1/2017 | Satoh |
| 2018/0322827 A1* | 11/2018 | Zhang ................. G09G 3/3241 |

OTHER PUBLICATIONS

European Search Report from European Patent Office for European Application No. 21177233.0, pp. 1-10.

* cited by examiner

*Primary Examiner* — Mark W Regn
(74) *Attorney, Agent, or Firm* — Innovation Counsel LLP

(57) ABSTRACT

A replica pixel for testing a display IC that includes a driving circuit that drives a display panel and a sensing circuit that senses a received current is presented. The replica pixel includes a replica pixel transistor, which has a first terminal switchably coupled to a power source, a gate coupled to a first node of a capacitor, and a second terminal coupled to a second node of the capacitor. The first node of the capacitor is switchably coupled to a reference voltage Vref. The second node of the capacitor is switchably coupled to a coupling node, wherein the coupling node selectively couples to either the driving circuit or the sensing circuit. The replica pixel is approximately a real pixel without the display element, and may be used to test the display IC without assembling the display IC with a display panel.

20 Claims, 5 Drawing Sheets

REPLICA PIXEL FOR STAND-ALONE TEST OF DISPLAY DRIVER

CROSS-REFERENCE TO RELATED APPLICATION(S)

This application claims the benefit of U.S. Provisional Patent Application No. 63/104,246 filed on Oct. 22, 2020, the content of which is incorporated by reference herein.

BACKGROUND

Organic light emitting diode (OLED) display devices include many pixels. To cause a pixel to display a particular color value, the display device drives a corresponding voltage value to the pixel. This voltage value activates a transistor in the pixel causing current to flow through a diode in the pixel. However, defects in the pixel (e.g., in the transistor) may cause the pixel to output an unexpected color responsive to the voltage value.

To test the pixels, a Drive & Sense IC (display IC) is connected to a display panel so the pixels on the display panel can be driven. If a pixel, in response to being driven, outputs a correct color, that output indicates that the display IC and the pixel are both functioning as intended. However, if the output is unexpected, indicating that the display IC is likely to be defective (as the display panel is separately tested), the display panel to which it is connected often ends up wasted.

It is desirable to have a display IC 10 that can be tested without being assembled with the panel 100 so that good panels would not need to be discarded due to their connection to a defective display IC.

SUMMARY

In one aspect, the disclosure pertains to a replica pixel for testing a display IC, wherein the replica pixel is free of a display element. The replica pixel includes a replica pixel transistor, which in turn has a first terminal (e.g., a drain) that is switchably coupled to a power source, a gate coupled to a first node of a capacitor, and a second terminal (e.g., a source) coupled to a second node of the capacitor. The first node of the capacitor is switchably coupled to a reference voltage Vref. The second node of the capacitor is switchably coupled to a coupling node, wherein the coupling node selectively couples to either a driving circuit or a sensing circuit.

In another aspect, the disclosure pertains to a display IC chip that includes a pixel driving circuit, a sensing circuit, and the above-described replica pixel without a display element coupled to the pixel driving circuit and the sensing circuit.

In yet another aspect, the disclosure pertains to a method of testing a display IC. The method includes setting a voltage across a capacitor to zero, wherein the capacitor has a first node and a second node, the first node being coupled to a gate of a transistor having a first terminal and a second terminal, the first node switchably receiving a reference voltage $V_{ref}$ via a first scan enable transistor, and the second node being coupled to the second terminal and a coupling node, and wherein the first terminal is coupled to a power source through an emit transistor. The method further entails setting a voltage across the capacitor to zero, driving the coupling node to set the voltage across the capacitor to a nonzero value, and closing the first scan enable transistor and opening the emit transistor and the second scan enable transistor to generate a test current flowing to the coupling node.

In yet another aspect, the disclosure pertains to a method of testing a display IC by providing a display IC chip that includes a driving circuit and a sensing circuit, and disposing a replica pixel on the display IC chip and connecting the replica pixel to the display IC chip. The replica pixel has circuitry of a real pixel but without a display element. The replica pixel is driven in the manner a real pixel would be driven, and the resulting test current is sensed to evaluate a quality of the display IC.

DETAILED DESCRIPTION OF EMBODIMENTS

Figure 1:
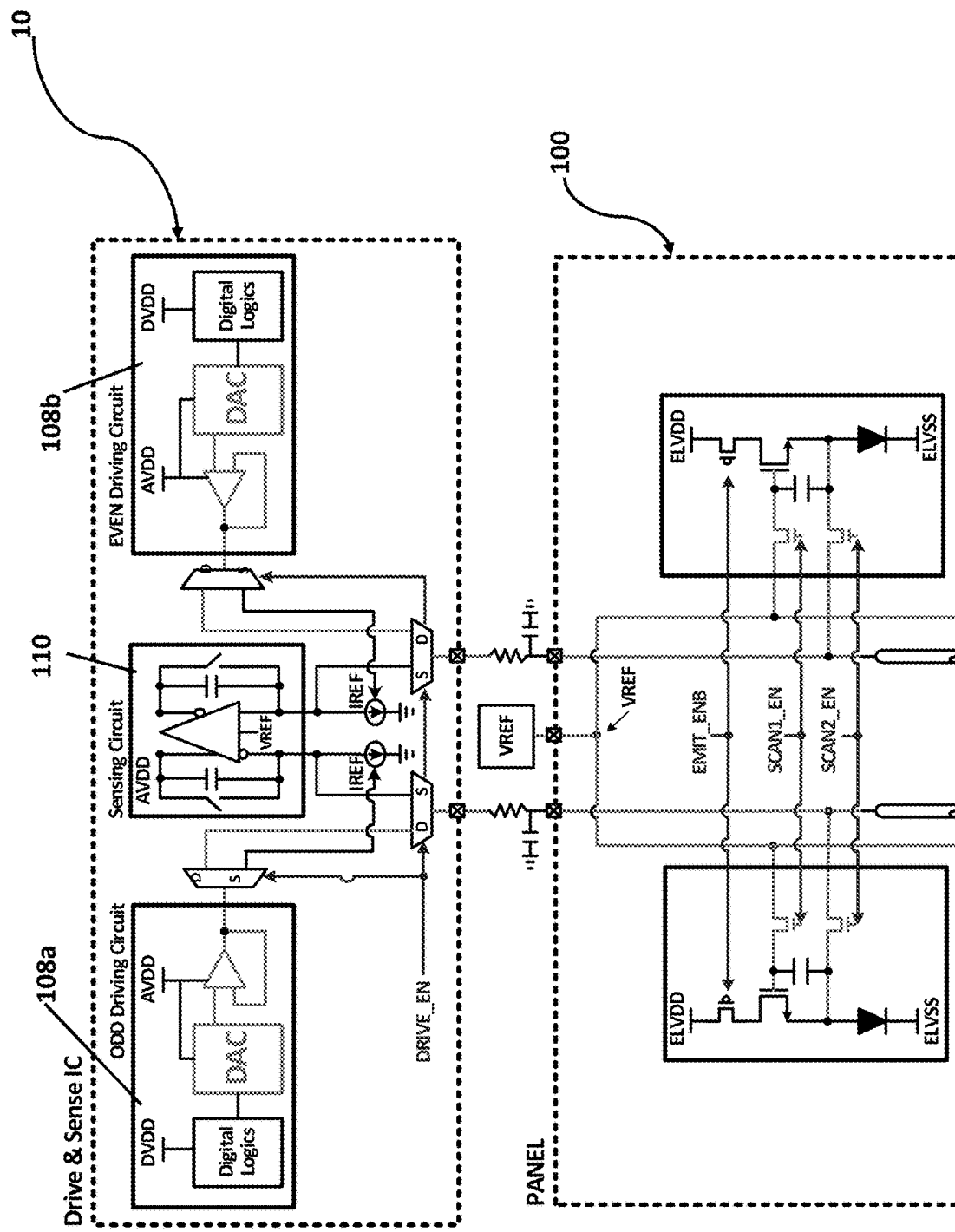
FIG. 1 depicts a conventional Drive & Sense IC (Display IC) connected to a display panel 100.

FIG. 1 depicts a Drive & Sense IC (Display IC) 10. Display IC includes a drive and sensing circuit that drives and senses pixels on a display panel at the front-end. As shown, display IC 10 includes a sensing circuit 110, an odd driving circuit 108a and an even driving circuit 108b (together referred to as "drive circuit 108"). The Display IC 10 is connected to a panel 100 through an assembly process to be tested. The sensing circuit 110 is configured to sense a current flowing through a pixel of the panel 100 responsive to a voltage value.

A disadvantage with the design of the display IC 10 is that by the time testing is done on the Display IC 10, it is already assembled with the display panel 100. Accordingly, it may be difficult to tell whether there is an error in the panel 100 or the Display IC 100 in the event that the sensing circuit 110 outputs an unexpected result during testing. Further, once a drive and sensing circuit is attached to a pixel panel, it may be difficult to detach the drive and sensing circuit from the pixel panel 100. Accordingly, determining whether a drive and sense circuit is faulty prior to attaching the drive and sense circuit to the pixel panel may save cost and ensure that results of the drive and sensing circuit accurately represent a condition of an associated pixel.

A display device may include a display IC 10 that includes a pixel driving circuit 108 to drive a voltage to a pixel and a sensing circuit 110 to detect current $I_{pixel}$ flowing through the pixel as a result of the voltage. If the current flowing through the pixel responsive to a particular voltage value does not match an expected value (e.g., $I_{threshold}$), there may be a defect in the display panel 100, the drive circuit 108, or the sensing circuit 110. However, without additional information it may not be possible to tell which part has the defect. As the display IC 10 has to be connected to the display panel 100 for a conventional test, both pieces have to be discarded even if the defect is only in the display IC 10. The method and apparatus disclosed herein provides a method to test the display IC 10 without permanently attaching it to the display panel 100.

A "multiplexer," as used herein, is intended to include any form of coupling that allows switching between two or more circuits, and includes magnetic or optical coupling as well as electrical coupling. "Switchably coupled," as used herein, is intended to include being coupled via a switch that can turn the coupling on/off. A "display element," as used herein, is intended to include elements used in a display panel to generate a visual image, including but not limited to light-emitting diodes or liquid crystal molecules.

Figure 2:
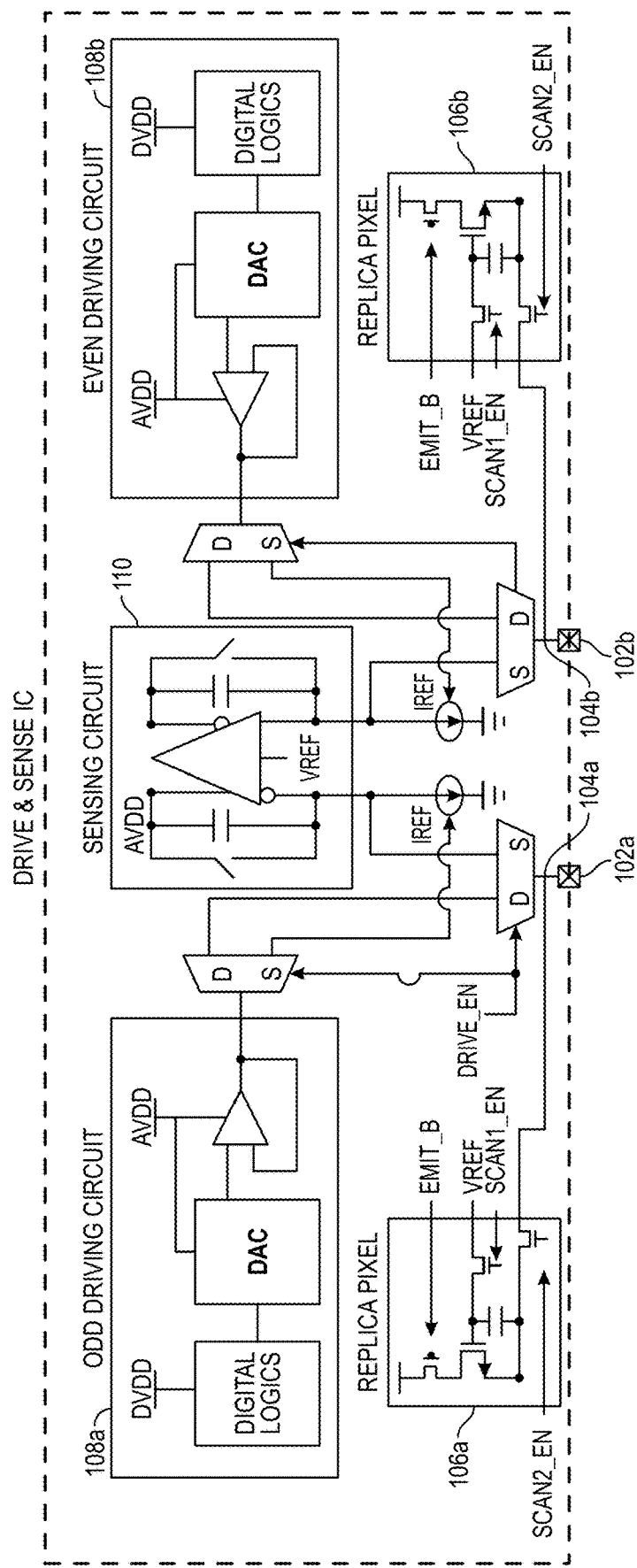
FIG. 2 depicts an example of display IC that includes a replica pixel, in accordance with an embodiment of the disclosure.

FIG. 2 depicts an example of display IC circuit that includes a sense circuit 110, a first drive circuit 108a, a second drive circuit 108b (drive circuits 108a and 108b are collectively referred to as "drive circuit 108"), a replica pixel 106a, a replica pixel 106b (replica pixels 106a and 106b are collectively referred to as "replica pixel 106"), a first coupling node 104a, a second coupling node 104b (collectively referred to as "coupling node 104"), and a first panel connector 102a, and a second panel connector 102b (collectively "panel connector 102") in accordance with an embodiment of the disclosure. In this particular embodiment, the first drive circuit 108a and the second drive circuit 108b each drives different sections of the display panel, and are arranged as mirror images of each other. The panel connector 102 is configured to be connected to a panel 100 of a display device. The drive circuit 108 and the sensing circuit 110 are connected to the coupling node 104 through a multiplexer that is configured to select between the two circuits. The drive circuit 108 drives a voltage (e.g., corresponding to a color value) to the coupling node 104. The sense circuit 110 is also connected to the coupling node 104 and is configured to sense a current flowing through the coupling node 104. The replica pixel 106 is connected to the coupling node 104 and is configured to output a test current to the coupling node 104 in response to receiving the voltage output by the drive circuit 108.

Although FIG. 2 depicts an on-chip version of the replica pixel 106 that is integrated with the display IC, this is not a limitation of the inventive concept.

Figure 3:
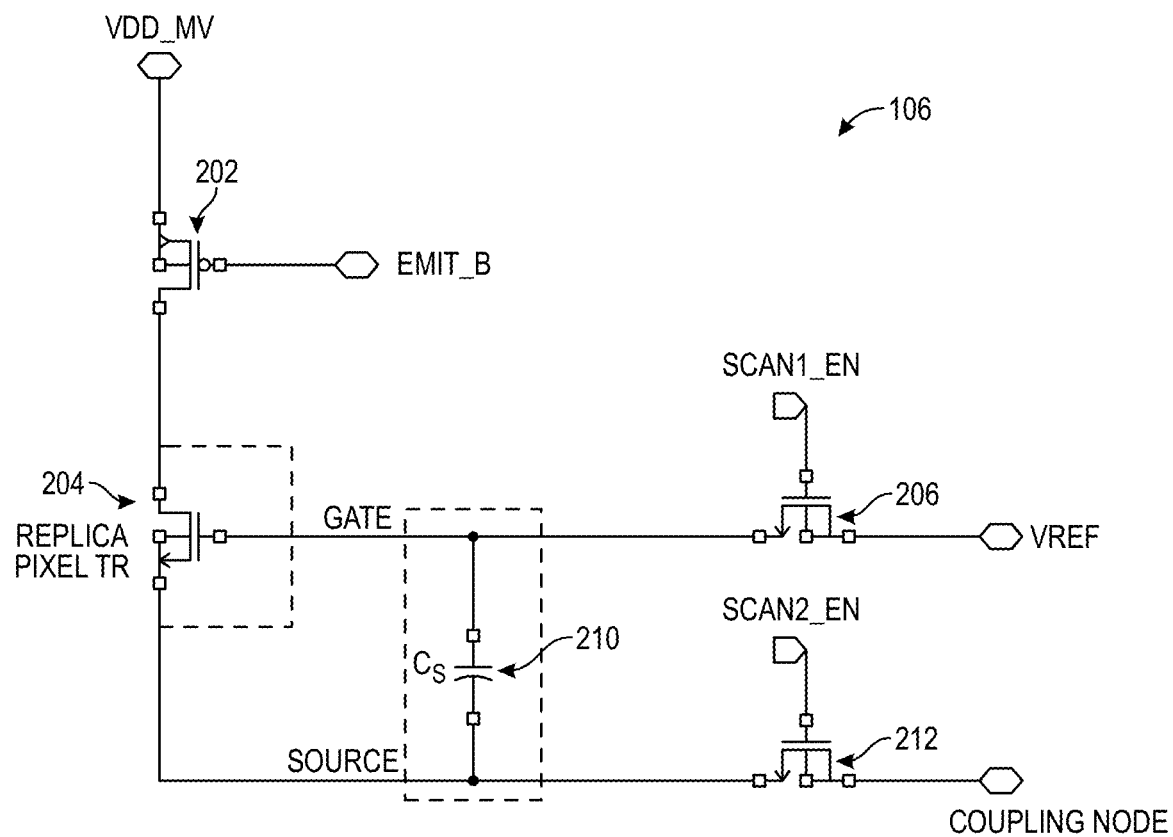
FIG. 3 depicts the replica pixel in accordance with an embodiment of the disclosure.

FIG. 3 depicts the replica pixel 106 in accordance with an embodiment of the disclosure. A "replica pixel," such as the replica pixel 106, has a similar configuration to a real pixel on the panel 100 that would be connected to the panel connector 102 in the end product except that it lacks a display element, such as a diode depicted in FIG. 1. In the illustrated example, the replica pixel includes a replica pixel transistor 204 and a capacitor 210. The first terminal (e.g., the drain) of the replica pixel transistor 204 is connected to a power supply (Vdd_mv) switchably, through an emit transistor 202. The gate of the replica pixel transistor 204 is coupled to a first node of the capacitor 210, which is switchably connected to a voltage Vref through a first enable transistor 206. The first enable transistor 206 is controlled by a first scan signal scan1_en from the driver circuit 108. The second terminal (e.g., the source) of the replica pixel transistor 204 is coupled to a second node of the capacitor 210 and switchably connected to a coupling node 104. A second enable transistor 212, which receives gate signals in the form of a second scan signal scan2_en from the drive circuit 108, switches on and off the connection between the second node of the capacitor 210 and the coupling node 104.

As a replica pixel has no display element, in the embodiments of FIG. 2 and FIG. 3, there is a wire that exclusively connects the second terminal of the replica pixel transistor 204 to the second node of the capacitor 210. The second terminal of the replica pixel transistor 204 is only connected directly to the second node of the capacitor 210 and connected switchably to the coupling node. The second terminal of the replica pixel transistor 204 is not connected to any display element.

Figure 4:
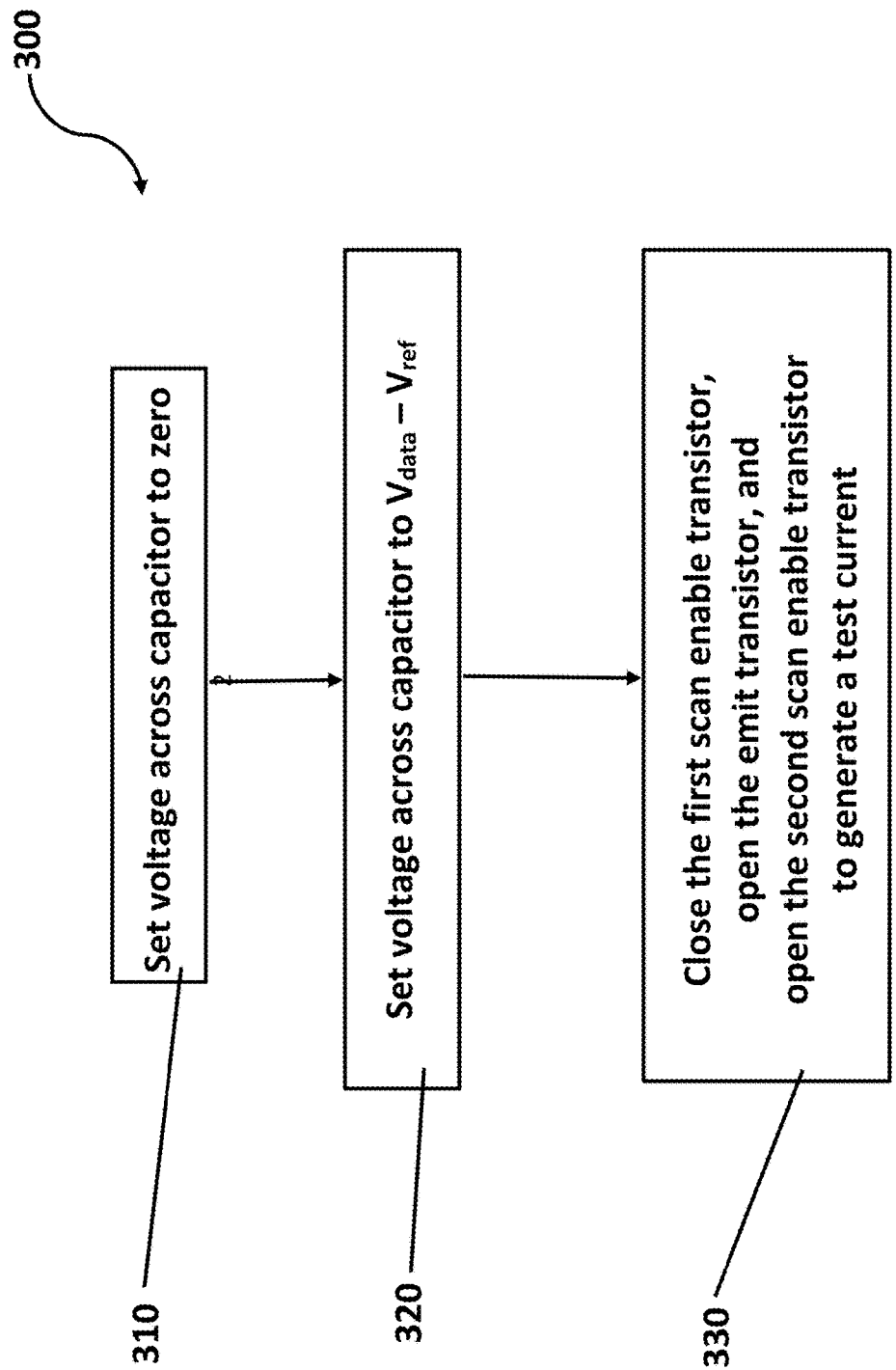
FIG. 4 is a flowchart depicting a method for testing the display IC in accordance with an embodiment of the disclosure.

FIG. 4 is a flowchart depicting a testing method 300 for testing a display IC (e.g., the drive circuit 108 and the sense circuit 110 of FIG. 2) in accordance with an embodiment of the disclosure. The testing method 300, as performed by the driving circuit 108, entails initially setting the voltage across the capacitor 210, or Vcs, to zero (block 310). This may be achieved by turning on the first enable transistor 206 and the second enable transistor 212, turning off the emit transistor 202, and driving the coupling node 104 to the reference voltage $V_{ref}$ using the drive circuit 108.

In block 320, the drive circuit 108 apples a data voltage $V_{data}$ to the coupling node 104. This sets the voltage across the capacitor 210, Vcs, to $V_{data}-V_{ref}$.

After Vcs is settled at $V_{data}-V_{ref}$, a test current is generated in block 330. The first enable transistor 206 is turned off and the emit transistor 202 is turned on. The second enable transistor 212 is turned on and the multiplexer switches from the driving circuit 108 to the sensing circuit 110. The emit transistor 202 being turned on causes the replica pixel 106 to output a test current to the coupling node and the coupling node 104 based on the Vcs of the capacitor 210. The sensing circuit 110 reads the test current and, based on the value of the test current (e.g., above or below a predefined threshold), allows a determination to be made about the quality of the display IC 10.

If the test current has the expected relationship (e.g., above or below) with respect to the predefined threshold value, the display IC may be connected to pixel panel (e.g., the panel 100 may be connected to the panel connector 102). Accordingly, the replica pixel of FIG. 3 and the test method of FIG. 4 may be used to evaluate the quality of a drive and sense circuit prior to coupling the drive and sense circuit to a display panel. Accordingly, wasting good panels may be avoided.

Figure 5:
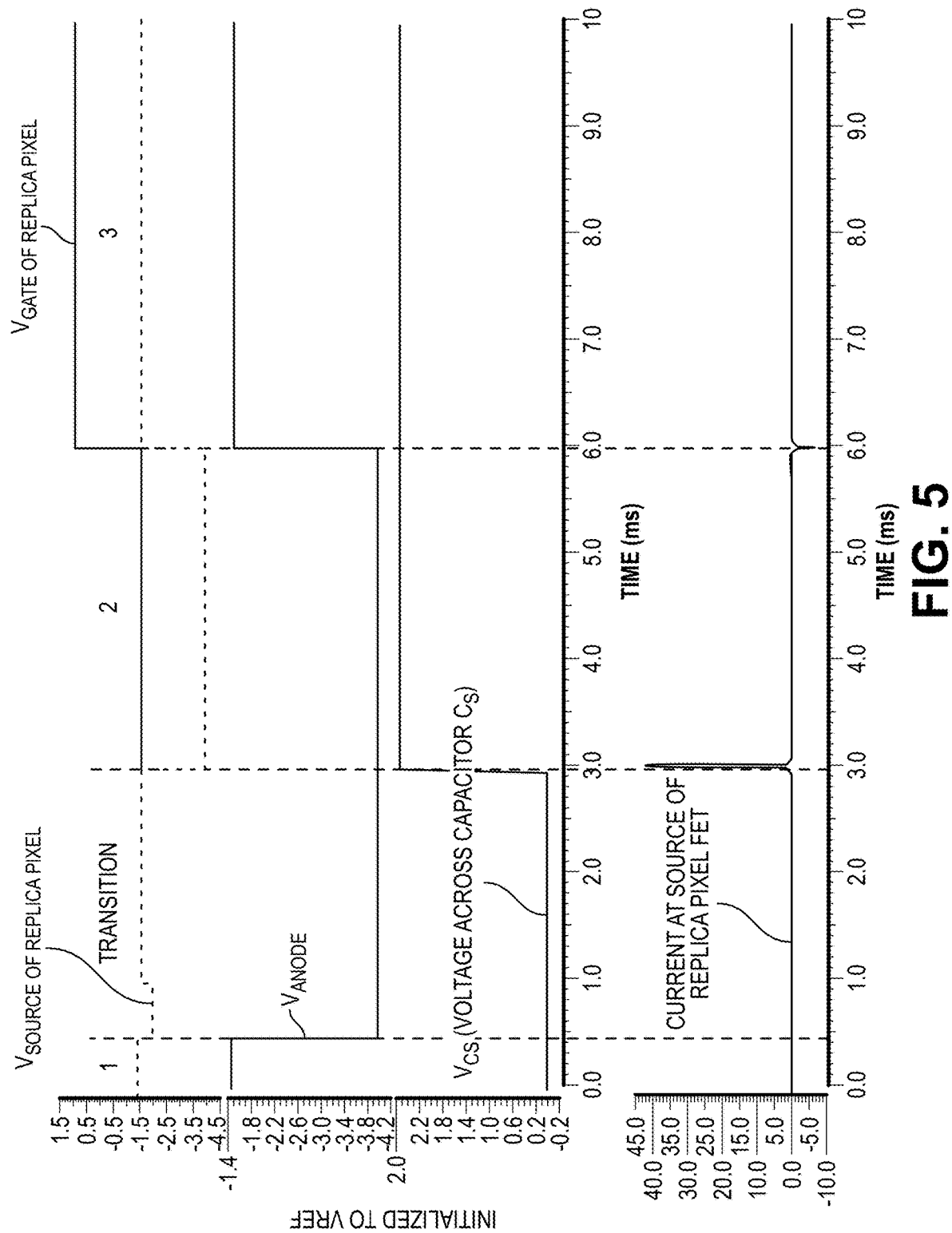
FIG. 5 depicts the state of the replica pixel during testing, in accordance with an embodiment of the disclosure.

FIG. 5 depicts the testing method 300 of the disclosure in more detail. In the example that is shown, the replica pixel is configured to draw approximately 1-10 nA of current by storing a suitable voltage across the capacitor Cs and using the stored voltage to suitably bias the replica pixel FET to provide the desired current of 1-10 nA. Referring to FIG. 5, the sequence of events during the testing method 300 is as follows.

Initially, in Stage 1, the first enable transistor 206, the second enable transistor 212, and emit transistor 202 are logic high. The first enable transistor 206 and the second enable transistor 212 are turned on, while the emit transistor (being a PMOS transistor in this example) is turned off. The voltage at the coupling node ($V_{anode}$) is driven by the driver circuit 108 to $V_{ref}$ such that the voltage across capacitor 210 (Vcs) is zero. In this stage (corresponding approximately to block 310 of FIG. 4), the voltage $V_{gate}$ at the gate of the replica pixel transistor 204 and the voltage $V_{source}$ at the second terminal of the replica pixel transistor are about the same, or about −1.5V in the particular example.

After the initial setup, the coupling node 104 is driven to $V_{data}$, which may be about −4 V in the example shown. The first enable transistor 206, the second enable transistor 212, and the emit transistor 202 are still logic high. The second enable transistor may be at logic low (i.e., be turned off) while the coupling node transitions to $V_{data}$ (−4V) without affecting the operation significantly. $V_{gate}$ and $V_{source}$ of the replica pixel transistor 204 remain substantially matching during most of this transition stage.

Stage 2 of FIG. 5 depicts the state of the replica pixel 106 after $V_{anode}$ is settled at $V_{data}$. In reaction to this change in $V_{anode}$, the voltage Vcs across the capacitor changes from 0 to a new value, shown as about 2.5 V in the example. $V_{source}$ of the replica pixel transistor 204 changes to about −4 V while $V_{gate}$ remains at about −1.5 V. The difference between $V_{source}$ and $V_{gate}$ matches Vcs (2.5 V). The change in the voltage $V_{anode}$ of the coupling node changes Vcs, which in turn causes a test current to flow through to the coupling node.

In Stage 3 of FIG. 5, the first enable transistor 206 is turned off (goes logic low). Voltage at the gate of the replica pixel transistor $V_{gate}$ is no longer $V_{ref}$. The second enable transistor 212 turns on, and the coupling node 104 is disconnected from the driver output and multiplexed over to the input of the sensing front end circuit. The first enable transistor 206 is turned off. The anode 104 (which is the same as $V_{source}$) returns to $V_{ref}$ (−1.5 V in this example), and $V_{gate}$ is $V_{ref}$+Vcs. This turns on the apparatus, and the emit transistor turns on to supply power (Vdd_mv) to the replica pixel 106. This causes a test current mimicking a real pixel to flow through the replica pixel 106 and to the coupling node 104. The sensing circuit 110 senses the test current that is used for quality evaluation.

The replica pixel 106 allows testing of the Display IC chip (both driving and sensing circuitry) without attaching the Display IC chip to a display panel 100. Operation uses same signaling controls as the display panel; hence, minimal modification is needed between testing with the replica pixel 106 and functioning with the panel 100. The on-chip replica pixel 106 allows detection of defective DIC chips before they get assembled onto display panels, resulting in cost savings.

While the inventive concept has been described in connection with what is presently considered to be practical embodiments, it is to be understood that the inventive concept is not limited to the disclosed embodiments. On the contrary, the disclosure is intended to cover various modifications and equivalent arrangements included within the spirit and scope of the appended claims.

What is claimed is:

1. A replica pixel for testing a display IC that includes a driving circuit that drives a display panel and a sensing circuit that senses a received current, the replica pixel comprising:
a replica pixel transistor having:
a first terminal switchably coupled to a power source;
a gate coupled to a first node of a capacitor, wherein the first node of the capacitor is switchably coupled to a reference voltage $V_{ref}$; and
a second terminal coupled to a second node of the capacitor, wherein the second node of the capacitor is switchably coupled to a coupling node, wherein the coupling node selectively couples to either the driving circuit or the sensing circuit;
wherein the replica pixel is free of a display element.

2. The replica pixel of claim 1, wherein the replica pixel is on the display IC chip, the driving circuit and the sensing circuit being coupled to the coupling node.

3. The replica pixel of claim 1, wherein the coupling node is coupled to a multiplexer that is configured to selectively connect the coupling node to either the driving circuit or the sensing circuit.

4. The replica pixel of claim 3, wherein the coupling node is configured to receive a driving voltage from the driving circuit and configured to return a test current to the sensing circuit, the test current indicating a quality of the display IC.

5. The replica pixel of claim 1, wherein the second terminal is coupled directly to only the second node of the capacitor and switchably only to the coupling node.

6. The replica pixel of claim 1, further comprising a wire that exclusively connects the second terminal to the second node of the capacitor.

7. A method of testing a display IC, comprising:
setting a voltage across a capacitor to zero, wherein the capacitor has a first node and a second node, the first node being coupled to a gate of a transistor having a first terminal and a second terminal, the first node switchably receiving a reference voltage $V_{ref}$ via a first scan enable transistor, and the second node being coupled to the second terminal and a coupling node, and wherein the first terminal is coupled to a power source through an emit transistor;
driving the coupling node to set the voltage across the capacitor to a nonzero value; and
closing the first scan enable transistor and opening the emit transistor and the second scan enable transistor to generate a test current flowing to the coupling node.

8. The method of claim 7 further comprising comparing the test current value to a predefined threshold current.

9. The method of claim 7 further comprising selectively connecting a sensing circuit and a driving circuit to the coupling node one at a time.

10. The method of claim 9 further comprising providing the sensing circuit and the driving circuit on a same chip as the replica pixel.

11. The method of claim 7, wherein the setting of the voltage across the capacitor to zero comprises:
turning on the first scan enable transistor and the second scan enable transistor;
turning off the emit transistor; and
applying the reference voltage $V_{ref}$ to the coupling node.

12. The method of claim 7, wherein the driving of the coupling node to set the voltage across the capacitor to a nonzero value comprises applying a driving voltage $V_{data}$ to the coupling node.

13. A display IC chip comprising:
a pixel driving circuit and a sensing circuit; and
a replica pixel without a display element coupled to the pixel driving circuit and the sensing circuit, the replica pixel having a replica pixel transistor that comprises:
a first terminal switchably coupled to a power source;
a gate coupled to a first node of a capacitor, wherein the first node of the capacitor is switchably coupled to a reference voltage $V_{ref}$; and
a second terminal coupled to a second node of the capacitor, wherein the second node of the capacitor is switchably coupled to a coupling node, wherein the coupling node selectively couples to either a driving circuit or a sensing circuit.

14. The display IC chip of claim 13, wherein the pixel driving circuit and the sensing circuit are coupled to the coupling node through a multiplexer that selects between the pixel driving circuit and the sensing circuit.

15. The display IC chip of claim 13, further comprising a panel connector configured to couple the coupling node to a display element.

16. The display IC chip of claim 13, wherein the pixel driving circuit is a first pixel driving circuit coupled to a first multiplexer, further comprising a second pixel driving circuit coupled to a second multiplexer.

17. The display IC chip of claim 16, wherein the replica pixel is a first replica pixel connected to the first multiplexer, wherein first multiplexer is configured to selectively connect the first replica pixel to either the first driving circuit or the sensing circuit.

18. The display IC chip of claim 17, further comprising a second replica pixel connected to the second multiplexer, wherein the second multiplexer is configured to selectively connect the second replica pixel to either the second driving circuit or the sensing circuit.

19. The display IC chip of claim 13, wherein the second terminal is coupled to only the second node of the capacitor and to a switch to the coupling node.

20. The display IC chip of claim 13, further comprising a wire that exclusively connects the second terminal to the second node of the capacitor.

* * * * *